United States Patent [19]

Neal et al.

[11] Patent Number: 4,648,508
[45] Date of Patent: Mar. 10, 1987

[54] FLEXIBLE ENVELOPE FOR ELECTRONIC COMPONENT PACKAGING

[75] Inventors: Robert A. Neal, East Rd., Wales, Me. 04280; Robert Ray, Lake Shore Dr., Auburn, Me. 04210

[73] Assignees: Robert A. Neal; Robert Ray, both of Greene, Me.

[21] Appl. No.: 746,308

[22] Filed: Jun. 19, 1985

[51] Int. Cl.$^4$ .................... B65D 73/02; B65D 85/42
[52] U.S. Cl. .................... 206/328; 428/922
[58] Field of Search .................... 206/328, 524.6, 332, 206/334; 428/922, 215; 150/1

[56] References Cited

U.S. PATENT DOCUMENTS

| | | |
|---|---|---|
| 4,154,344 | 5/1979 | Yenni, Jr. et al. .................. 206/328 |
| 4,424,900 | 1/1984 | Petcavich ........................... 206/328 |
| 4,471,872 | 9/1984 | Dedow ............................... 206/328 |
| 4,482,048 | 11/1984 | Blodgett ............................ 206/328 |
| 4,532,099 | 7/1985 | Kaji .................................. 206/328 |

FOREIGN PATENT DOCUMENTS 2821182  11/1979  Fed. Rep. of Germany ...... 206/328

Primary Examiner—Joseph Man-Fu Moy
Attorney, Agent, or Firm—Auslander & Thomas

[57] ABSTRACT

The invention features a single film construction with two distinctly different surface characteristics for the purpose of an electronic package composite. The non-abrading outside conductive layer integrally bonded to an anti-static interior layer forms a faraday cage package characterized by surface resistivities of less than $10^3$ ohms per square on the outside and less than $10^{12}$ ohms per square on the inside.

12 Claims, 3 Drawing Figures

FLEXIBLE ENVELOPE FOR ELECTRONIC COMPONENT PACKAGING

FIELD OF THE INVENTION

The invention relates to anti-static bags or envelopes utilized for the storage and shipment of electronic components, and more particularly, to a reusable anti-static envelope having an outer conductive, carbon-contained plastic layer integrally coextruded with an inner anti-static plastic layer while the plastics are in a liquid state.

BACKGROUND OF THE INVENTION

In recent times, plastic composites have been fabricated into anti-static bags and envelopes. These are utilized to protect sensitive electronic components and chips from electrical charges and static electricity, thus preventing their damage. While various laminates of plastic have been suggested as desirable anti-static composites, most have the drawback that the thin metal conductive layer of the composite tends to abrade or crack. Abrasion is a particularly troublesome problem, since it not only diminishes the effectiveness of the bag or envelope in protecting the components, but the "flaking" or "crumbing" of the metal forms a contaminate. These contaminates can damage rather than protect the electronic components contained in the envelopes.

Usually several layers of plastic are used to form these anti-static envelopes in order to add mechanical strength and durability to the package. However, most packages are vulnerable to breakdown of their protective metal layer.

Where plastic composites have been impregnated with carbon to provide a conductive property, they have been found to lack mechanical strength. Such layers are usually bonded to another layer by an aluminum paste adhesive, as taught in U.S. Pat. No. 4,337,285 issued June 29, 1982, U.S. Pat. No. 4,478,903, issued Oct. 23, 1984, a composite wrapping or packaging sheet having a carbon-impregnated conductive covering layer laminated by coextruding this layer on the face of a substrate, is suggested. However, this patent does not suggest that such a coextruded laminate can be formed into a flexible bag or envelope. The coextruded composite is formed from non-flexible plastics, such as styrene and an ABS copolymer.

BRIEF SUMMARY OF THE INVENTION

The present invention fabricates a flexible anti-static bag or envelope by the process of blow film coextrusion. The envelope has an inner anti-static polyethylene layer and an outer conductive carbon-containing polyethylene layer which is made integral with the inner layer by coextruding the polyethylenes in the liquid state. Thus, a single film layer is formed, having two distinctly different properties.

The inner anti-static layer has a surface resistivity of less than approximately $10^{12}$ ohms per square to minimize triboelectric charge buildups, which avoids damage to electronic components. The outer conductive layer has a surface resistivity of less than approximately $10^3$ ohms per square.

The thickness of each plastic layer is approximately from 2 to 4 mils.

The carbon contained in the outer polyethylene layer ranges from 15 to 40 percent by weight. The outer layer forms a faraday cage.

The plastics are coextruded into a tube or sheet at a temperature in the range of 320° F. to 350° F. The envelope is then formed by conventional polyethylene bag making equipment with heat sealing and cutting bars.

BRIEF DESCRIPTION OF THE DRAWINGS

Although such novel feature or features believed to be characteristic of the invention are pointed out in the claims, the invention and the manner in which it may be carried, may be further understood by reference to the description following and the accompanying drawing.

DETAILED DESCRIPTION OF THE INVENTION

Referring now to the figures in greater detail, where like reference number denote like parts in the various figures.

Figure 1:
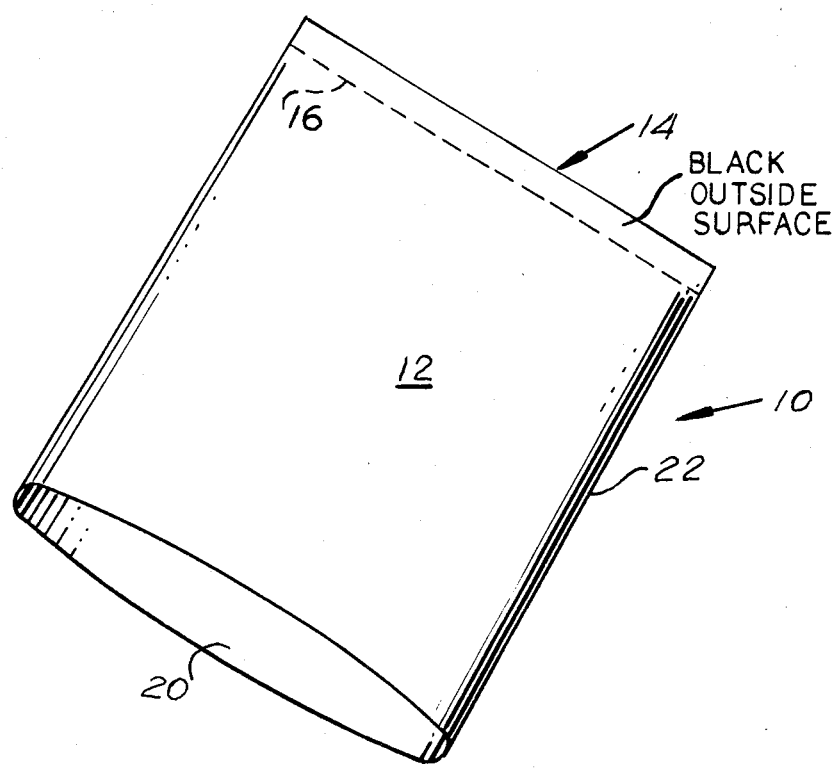
FIG. 1 is a perspective view of an electronic anti-static package of this invention utilizing an outer conductive surface and inner anti-static surface.

FIG. 1 is a view of an anti-static electronic package 10 having a tube 12 of a single film of composite material that is cut at 14 to length and heat sealed along the bottom edge 16 to form an envelope. The inner layer 20 of the envelope comprises an anti-static, heat sealable plastic, and the outer layer 22 comprises a conductive plastic.

Figure 2:
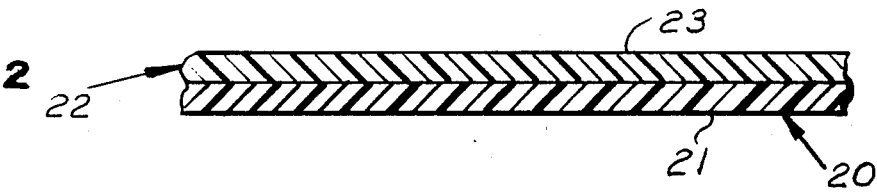
FIG. 2 is an enlarged sectional view of the layers of the package of FIG. 1 illustrating the two distinctly different layers forming one integral film.

Referring to FIG. 2, an enlarged sectional view of the tubular material 12 of the single film of the composite material envelope illustrated in FIG. 1. The inner layer 20 is comprised of a heat sealable anti-static polyolefin. The anti-static surface 20 may be made of many polymers which will accept the addition of a wide variety of internal anti-static, such as amines, anioncis and others at levels which result in surface resistivities of less than $10^{12}$ ohms per square. The anti-static surface 21 will meet the electrical test of the federal test method STD 101, test method 4046, which is to dissipate a 5000 volt applied positive or negative charge to technical zero volts (50 volts or less) in less than two seconds when conditioned to 72° F. and 15 percent relative humidity. The outer layer 22 may be made from a number of polymers and copolymers which allow loading of conductive materials and fillers to levels in which surface 23 has a resistivity of less than $10^3$ ohms (i.e. low resistance shunt path). Types of polymers can be low density polyethylene, linear low density polyethylene, high density polyethylene and many other polymers and copolymers.

Figure 3:
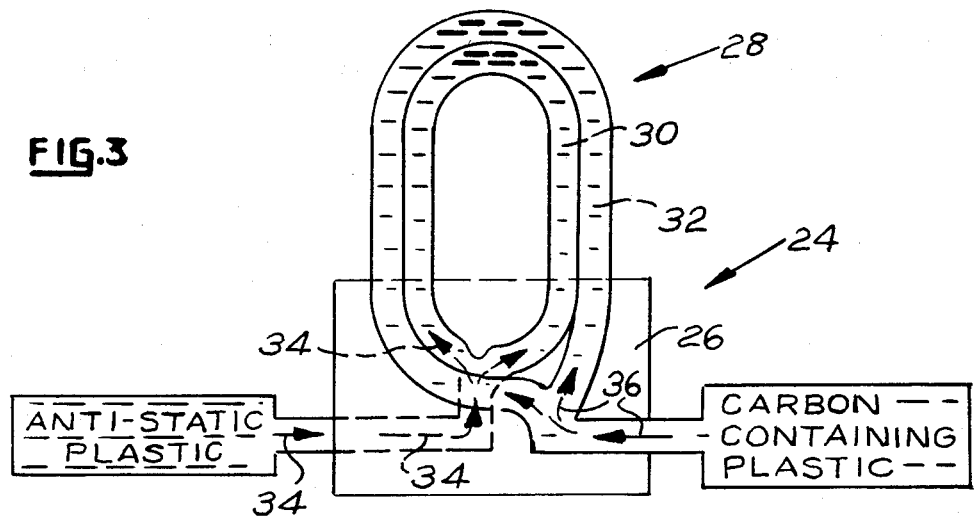
FIG. 3 is a schematic sectional view of the electronic anti-static film package of FIG. 1 being manufactured by a coextruder.

Referring to FIG. 3, a schematic sectional view of a coextruder 24 (Kieffel Coextrusion Film Line), manufacturing a single film of two layers, each having two distinctly different surface characteristics. The material that forms the plastic inner layer 20 of FIGS. 1 and 2 leaves the coextruder die 26 (arrows 34) in liquid form 30 and cools to form the inner layer of a bubble of blown film 28. The material that forms the conductive plastic outer layer 22 of FIGS. 1 and 2, leaves the coextruder die 26 (arrows 36) in liquid form 32 to form the outer layer of the bubble of blown film 28. The bubble of blown film 28 is achieved by injecting or forcing gas or air, under pressure, into the center of the tube of coextruded materials 30 and 32, which can be coextruded in tube or sheet form. The two materials bond together while in the liquid state and form an integral film 28 with two distinctly different surfaces 21 and 23, respectively, when cooled. Characteristics of blow rate and melt index of each type of polymer varies, but most are easily extruded, due to the inner layer 30 which supports the outer layer 32 in the form of a bubble of blown film 28.

The terms and expressions which are employed are used as terms of description; it is recognized, though, that various modifications are possible.

It is also understood the following claims are intended to cover all of the generic and specific features of the invention herein described; and all statements of the scope of the invention which as a matter of language, might fall therebetween.

Having described certain forms of the invention in some detail, what is claimed is:

1. An anti-static envelope having internal inner and outer layers of flexible plastics, said envelope layers being integrally formed by blow film coextrusion of said plastics while in a liquid state, said inner layer comprising an anti-static plastic with a surface resistivity of less than approximately $10^{12}$ ohms per square, and said outer layer comprising a conductive carbon-containing plastic having a surface resistivity of less than approximately $10^3$ ohms per square.

2. The anti-static envelope of claim 1, wherein said inner layer comprises a polyethylene plastic.

3. The anti-static envelope of claim 1, wherein said conductive outer layer comprises a carbon-containing polyethylene plastic.

4. The anti-static envelope of claim 2, wherein said conductive outer layer comprises a carbon-containing polyethylene plastic.

5. The anti-static envelope of claim 1, wherein the plastics are coextruded at a processing temperature of approximately between 320° F. and 350° F.

6. The anti-static envelope of claim 1, wherein said layers are blow film coextruded as a tube or sheet, and then gas under pressure is blown into said tube or sheet to form said envelope.

7. The anti-static envelope of claim 1, wherein said inner layer has an approximate thickness in a range from 2 to 4 mils.

8. The anti-static envelope of claim 1, wherein said outer layer has an approximate thickness in a range from 2 to 4 mils.

9. The anti-static envelope of claim 3, wherein said carbon-containing polyethylene plastic comprises carbon by weight in an approximate range of from one to twenty-five percent.

10. The anti-static envelope of claim 4, wherein said carbon-containing polyethylene plastic comprises carbon by weight in an approximate range of from fifteen to forty percent.

11. The anti-static envelope of claim 6, wherein said gas is air.

12. An anti-static envelope having inner and outer plastic layers that are integrally formed by means of blown film coextrusion, said inner and outer layers being formed into a coextruded sheet or tube while said plastics are in a liquid state and forcing gas into said tube to produce said envelope, said inner layer comprising an anti-static plastic with a surface resistivity of less than approximately $10^{12}$ ohms per square, and said outer layer comprising a conductive, carbon-containing plastic having a surface resistivity of less than approximately $10^3$ ohms per square.

* * * * *